US010251299B1

(12) United States Patent
Wang et al.

(10) Patent No.: US 10,251,299 B1
(45) Date of Patent: Apr. 2, 2019

(54) 14G PORTFOLIO BEZEL LOCK AND LATCHING MECHANISM

(71) Applicant: DELL PRODUCTS, L.P., Round Rock, TX (US)

(72) Inventors: Hsu-Chu Wang, Taipei (TW); Chuan-Chieh Tseng, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/719,879

(22) Filed: Sep. 29, 2017

(51) Int. Cl.
*H05K 7/14* (2006.01)
*E05B 65/00* (2006.01)
*E05C 9/10* (2006.01)
*E05C 9/02* (2006.01)

(52) U.S. Cl.
CPC ......... *H05K 7/1489* (2013.01); *E05B 65/006* (2013.01); *E05C 9/026* (2013.01); *E05C 9/10* (2013.01)

(58) Field of Classification Search
CPC .................................................. H05K 7/1489
See application file for complete search history.

(56) References Cited

U.S. PATENT DOCUMENTS

| 9,894,796 | B1* | 2/2018 | Christenson | .............. | F16B 2/18 |
| 2002/0190868 | A1* | 12/2002 | Dearborn | .............. | G06F 11/326 |
| | | | | | 340/691.1 |
| 2004/0195842 | A1* | 10/2004 | Lin | ........ | E05B 65/006 |
| | | | | | 292/116 |
| 2011/0279973 | A1 | 11/2011 | Terwilliger et al. | | |
| 2012/0236487 | A1* | 9/2012 | Wallace | ............... | H05K 7/1489 |
| | | | | | 361/679.31 |
| 2012/0236488 | A1* | 9/2012 | Wallace | ................. | H05K 5/023 |
| | | | | | 361/679.31 |
| 2012/0236493 | A1* | 9/2012 | Wallace | ............... | H05K 7/1489 |
| | | | | | 361/679.37 |
| 2012/0236494 | A1* | 9/2012 | Wallace | ............... | H05K 7/1489 |
| | | | | | 361/679.37 |
| 2015/0271935 | A1* | 9/2015 | Zhang | .................. | H05K 7/1489 |
| | | | | | 361/679.01 |
| 2016/0345453 | A1* | 11/2016 | Zhang | .................. | H05K 5/0234 |
| 2017/0079427 | A1* | 3/2017 | Chen | .................... | H05K 7/1489 |
| 2017/0290424 | A1* | 10/2017 | Chen | .................... | A47B 88/044 |

* cited by examiner

*Primary Examiner* — Binh B Tran
*Assistant Examiner* — Douglas R Burtner
(74) *Attorney, Agent, or Firm* — Isidore PLLC

(57) ABSTRACT

A bezel lock system includes a bezel, convert bracket (CB), and lock. The bezel attaches to a chassis panel. The CB slideably secures a latching bracket (LB) of the bezel to a chassis, when in a locked position. The CB slides a length of a release gap along a transverse path from the locked position to a released position. The lock restricts removal of the bezel from the chassis when the lock is engaged in a locked orientation (LO). The lock includes a cam bracket (CamB) that rotates between locked and unlocked orientations. In the LO, the CamB constrains the CB from moving inward on the path by abutting the CB; CB is confined between the LB and CamB. In the unlocked orientation, the CamB is disposed out of the CB's path, allowing the CB to retract inward to the release position, which allows the bezel to detach from the panel.

20 Claims, 10 Drawing Sheets

1500

```
PROVIDING A BEZEL CONFIGURED TO ATTACH TO A PANEL OF THE
SERVER CHASSIS
1506
           │
           ▼
PROVIDING A CONVERT BRACKET THAT SLIDEABLY SECURES A
LATCHING BRACKET OF THE BEZEL TO A FRAME OF THE SERVER
CHASSIS WHEN IN A LOCKED POSITION
1508
           │
           ▼
PROVIDING A BEZEL LOCK CONFIGURED TO RESTRICT REMOVAL OF
THE BEZEL FROM THE SERVER CHASSIS WHEN THE BEZEL LOCK IS
ENGAGED IN A LOCKED ORIENTATION
1510
           │
           ▼
PROVIDING THE LATCHING BRACKET
1512
           │
           ▼
PROVIDING A SEESAW BRACKET
1514
           │
           ▼
PROVIDING A SPRING CONFIGURED TO PULL THE UPPER END OF THE
SEESAW BRACKET FORWARD WHEN THE CAM BRACKET ROTATES TO
THE UNLOCKED ORIENTATION, THEREBY AUTOMATICALLY
RETRACTING THE CONVERT BRACKET TO THE RELEASED POSITION
1516
           │
           ▼
PROVIDING A RELEASE BUTTON COMPRISES A RELEASE BUTTON
SHAFT CONFIGURED TO INSERT WITHIN THE ANGLED SLOT OF THE
UPPER AND LOWER CAM HOLDERS
1518
```

*FIG. 15*

14G PORTFOLIO BEZEL LOCK AND LATCHING MECHANISM

BACKGROUND

1. Technical Field

The present disclosure generally relates to an information handling system and in particular to a 14G portfolio bezel lock and latching mechanism in an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can include components designed to be mounted in a rack or rack system. An example of such components is a rack-mount server. The rack system includes vertical posts that provide a frame with a plurality of mounting slots (also called bays), with each slot configured to hold a rack-mount server or another type of rack-mount component. When a rack-mount server is inserted into a mounting slot, a frame latch engages with the rack to retain the rack-mount server in the mounting slot of the rack. When the frame latch disengages from the rack, a user is allowed to remove the rack-mount server from the rack. The rack system allows multiple rack-mount servers to be stacked vertically, occupying less floor space and simplifying cable connections between servers than if the multiple servers were not stacked vertically.

Conventionally, bezel lock system, which includes its own latch as well as both a bezel and a bezel lock, is intended to restrict its latch from disengaging from the chassis of the rack-mount server while the bezel lock is in a locked orientation. Also, the bezel lock system is intended to allow a user to disengage (or unlatch) the latch from the chassis of the rack-mount server while the bezel lock is in an unlock orientation. Some standard sized bezels (for example, U2) have limited space for implementing moving components. An Industrial Design\Usability (ID\U) specification requires that the bezel cannot be detached from (for example, pulled out) the chassis of the rack-mount server by a weight of 17 kg or less. However, the latch of the conventional bezel lock system cannot fully lock the bezel, and the bezel could pull out of the rack-mount server by one hand of a user (namely, the force of the weight of 17 kg or less). Also, the conventional bezel lock system includes a release knob for operating the latch of the bezel lock system. The release knob is configured to be pushed by a user, but the release knob is too small and not easy to push. The release knob cannot provide a solid stop feeling when the user actuates (for example, presses) the release knob. The user may believe that the release knob did not unlatch the latch of the bezel lock system. The user may press harder on the release knob and try to pull the bezel, and then damage the bezel latch or chassis of the rack-mount server.

BRIEF SUMMARY

Disclosed are a bezel lock system, an information handling system (IHS), and method for manufacturing a bezel lock system for an IHS being a 14G portfolio bezel lock and latching mechanism. The method includes providing a bezel lock system by: (i) providing a bezel configured to attach to a panel of a server chassis; and (ii) providing a convert bracket and placing the convert bracket within the bezel such that the convert bracket slideably secures a latching bracket in a protruded state (as to secure the bezel to a frame of the server chassis) when in a locked position. The method includes configuring the convert bracket to slide a length of a release gap along a horizontal path from the locked position to a released position. The method further includes providing and configuring a bezel lock to restrict removal of the bezel from the server chassis when the bezel lock is engaged in a locked orientation. The method further comprises: including and arranging a rotating cam bracket within the bezel lock to rotate from the locked orientation to an unlocked orientation. In the locked orientation, the cam bracket constrains the convert bracket from moving inward on a horizontal path by abutting the convert bracket, and the convert bracket is confined horizontally between the latching bracket and the cam bracket in the locked orientation. In the unlocked orientation, the cam bracket is disposed out of the horizontal path of the convert bracket, allowing the convert bracket to retract inward to the release position and allowing the bezel to detach from the panel.

According to another embodiment of this disclosure, the IHS includes a server chassis, housing one or more server components. The IHS also includes a bezel lock system. The bezel lock system includes a bezel configured to attach to a panel of the server chassis. The bezel lock system includes a convert bracket that slideably secures a latching bracket of the bezel to a frame of the server chassis when in a locked position. The convert bracket is configured to slide a length of a release gap along a horizontal path from the locked position to a released position. The bezel lock system includes a bezel lock configured to restrict removal of the bezel from the server chassis when the bezel lock is engaged in a locked orientation. The bezel lock includes a rotating cam bracket configured to rotate from the locked orientation to an unlocked orientation. In the locked orientation, the cam bracket constrains the convert bracket from moving inward on a horizontal path by abutting the convert bracket, and the convert bracket is confined horizontally between the latching bracket and the cam bracket in the locked orientation. In the unlocked orientation, the cam bracket is disposed out of the horizontal path of the convert bracket, allowing the convert bracket to retract inward to the release position, which allows the bezel to detach from the panel.

According to another embodiment of this disclosure, a bezel lock system includes a bezel configured to attach to a panel of the server chassis. The bezel lock system includes a convert bracket that slideably secures a latching bracket of the bezel to a frame of the server chassis when in a locked position. The convert bracket is configured to slide a length of a release gap along a horizontal path from the locked position to a released position. The bezel lock system includes a bezel lock configured to restrict removal of the bezel from the server chassis when the bezel lock is engaged in a locked orientation. The bezel lock includes a rotating cam bracket configured to rotate from the locked orientation to an unlocked orientation. In the locked orientation, the cam bracket constrains the convert bracket from moving inward on a horizontal path by abutting the convert bracket, and the convert bracket is confined horizontally between the latching bracket and the cam bracket in the locked orientation. In the unlocked orientation, the cam bracket is disposed out of the horizontal path of the convert bracket, allowing the convert bracket to retract inward to the release position, which allows the bezel to detach from the panel.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 15 illustrates a method for manufacturing a bezel locking system for an Information Handling System (IHS), according to one or more embodiments of this disclosure.

DETAILED DESCRIPTION

Figure 1:
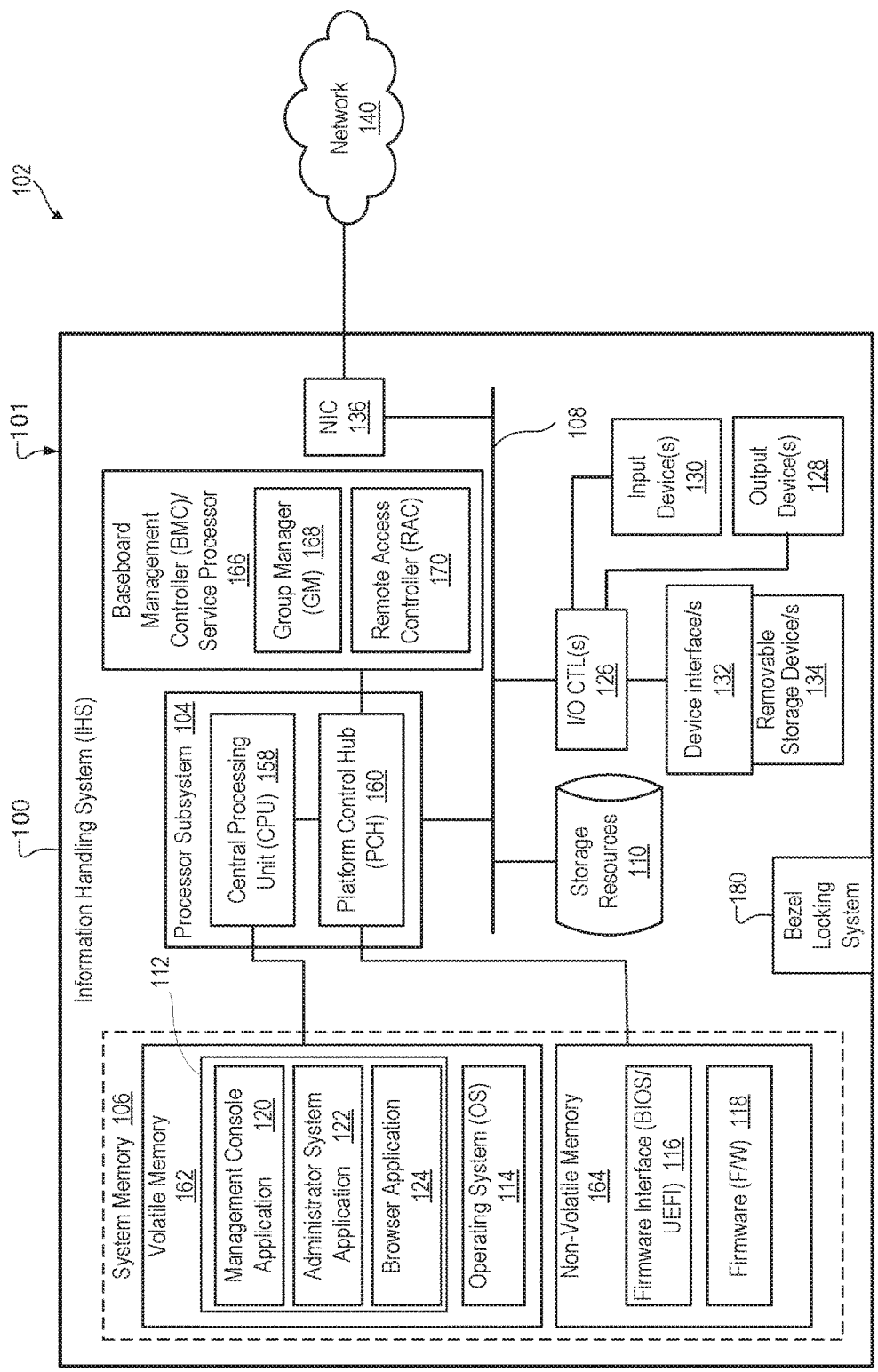
FIG. 1 illustrates an example information handling system within which various aspects of the disclosure can be implemented, according to one or more embodiments of this disclosure.

The illustrative embodiments provide a bezel locking system of an information handling system (IHS) and a method for manufacturing a bezel locking system for an IHS. The bezel locking system includes a bezel, a convert bracket, and a bezel lock. The bezel is configured to attach to a panel of a server chassis. The convert bracket slideably secures a latching bracket of the bezel to a frame of the server chassis when in a locked position. The convert bracket is configured to slide a length of a release gap along a horizontal path from the locked position to a released position and vice-versa. The bezel lock is configured to restrict removal of the bezel from the server chassis when the bezel lock is engaged in a locked orientation. The bezel lock includes a rotating cam bracket configured to rotate from the locked orientation to an unlocked orientation and vice versa. In the locked orientation, the cam bracket constrains the convert bracket from moving inward on a horizontal path by abutting the convert bracket, and the convert bracket is confined horizontally between the latching bracket and the cam bracket. In the unlocked orientation, the cam bracket is disposed out of the horizontal path of the convert bracket, allowing the convert bracket to retract inward to the release position, which allows the bezel to detach from the panel.

In the following detailed description of embodiments of the disclosure, specific embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Those of ordinary skill in the art will appreciate that the hardware, firmware/software utility, and software components and basic configuration thereof depicted in the following figures may vary. For example, the illustrative components of IHS 100 are not intended to be exhaustive, but rather are representative to highlight some of the components that are utilized to implement certain of the described embodiments. For example, different configurations of an IHS may be provided, containing other devices/components, which may be used in addition to or in place of the hardware depicted, and may be differently configured. The depicted example is not meant to imply architectural or other limitations with respect to the presently described embodiments and/or the general invention.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The IHS 100 may also include one or more buses operable to transmit communications between the various hardware components.

Referring specifically to FIG. 1, IHS 100 is illustrated within a computing network system 102. IHS 100 includes processor subsystem 104 coupled to system memory 106 via system interconnect 108.

System interconnect 108 can be interchangeably referred to as a system bus, in one or more embodiments. System interconnect 108 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. System interconnect 108 communicatively couples various system components including, for example, replaceable local storage resources 110, such as solid state drives (SDDs) and hard disk drives (HDDs). Within local storage resources 110 can be stored one or more software and/or firmware modules and one or more sets of data that can be utilized during operations of IHS 100. Specifically, in one embodiment, system memory 106 can retrieve from local storage resources 110 a plurality of such modules for execution by processor subsystem 104. The modules can include one or more of application(s) 112, operating system (OS) 114, a firmware interface 116 such as basic input/output system (BIOS) or Uniform Extensible Firmware Interface (UEFI), and platform firmware (FW) 118. These software and/or firmware modules have varying functionality when their corresponding program code is executed by processor subsystem 104 or secondary processing devices within IHS 100. For example, application(s) 112 may include a management console application 120, an administrator system application 122, and a browser application 124, each enabling IHS 100 to operate in one or more of the corresponding roles within computing network system 102.

IHS 100 includes I/O controllers 126 and device interface(s) 132. I/O controllers 126 support connection to and forwarding of output signals to one or more connected output devices 128, such as a monitor or display device or audio speaker(s). Additionally, in one or more embodiments, one or more input devices 130, such as an optical reader, a USB, a card reader, Personal Computer Memory Card International Association (PCMCIA) slot, and/or a high-definition multimedia interface (HDMI), can be associated with IHS 100. Device interface(s) 132 can be utilized to enable data to be read from or stored to corresponding removable storage device/s 134, such as a compact disk (CD), digital video disk (DVD), flash drive, or flash memory card. In one or more embodiments, device interface(s) 132 can further include general purpose I/O interfaces such as inter-integrated circuit ($I^2C$), system management bus (SMB), and peripheral component interconnect (PCI) buses.

IHS 100 comprises a network interface controller (NIC) 136. NIC 136 enables IHS 100 and/or components within IHS 100 to communicate and/or interface with other devices, services, and components that are located external to IHS 100. These devices, services, and components can interface with IHS 100 via an external network, such as example network 140, using one or more communication protocols that include transport control protocol (TCP/IP) and network block device (NBD) protocol. Network 140 can be a local area network, wide area network, personal area network, and the like, and the connection to and/or between network and IHS 100 can be wired, wireless, or a combination thereof. For purposes of discussion, network 140 is indicated as a single collective component for simplicity. However, it should be appreciated that network 140 can comprise one or more direct connections to other devices as well as a more complex set of interconnections as can exist within a local area network or a wide area network, such as the Internet.

Processor subsystem 104 can include a central processing unit (CPU) 158 that is augmented by a platform control hub (PCH) 160. CPU 158 can execute applications 112 and OS 114 in volatile memory 162 of system memory 106. PCH 160 interfaces with functional components of the IHS 100, such as non-volatile (NV) memory 164 of the system memory 106, firmware interface 116, platform firmware 118, and a baseboard management controller (BMC)/service processor 166. BMC/service processor 166 can also include a remote access controller (RAC) 170 enabling out-of-band communication for the IHS 100 by the baseboard management controller (BMC)/service processor 166 via the NIC 136 and network 140 to the network devices that are located external to IHS 100.

In accordance with embodiments of this disclosure, IHS 100 is physically configured as a 3-dimensional device with the above described functional compute components encased in an external casing (namely, chassis 101) to form a server. The server can be designed to be mounted to a rack system, providing a rack-mount server. Chassis 101 is made of a structurally rigid material that serves to enclose and protect the components of IHS 100 from physical damage. At least one open panel is provided within one side/face of the 3D configured chassis 101 to provide access to one or more of the internal compute components of IHS 100. The at least one open panel is configured for physical attachment by a bezel or a bezel locking system (BLS) 180 according to embodiments of this disclosure. More details of the BLS 180 are described below.

Figure 2:
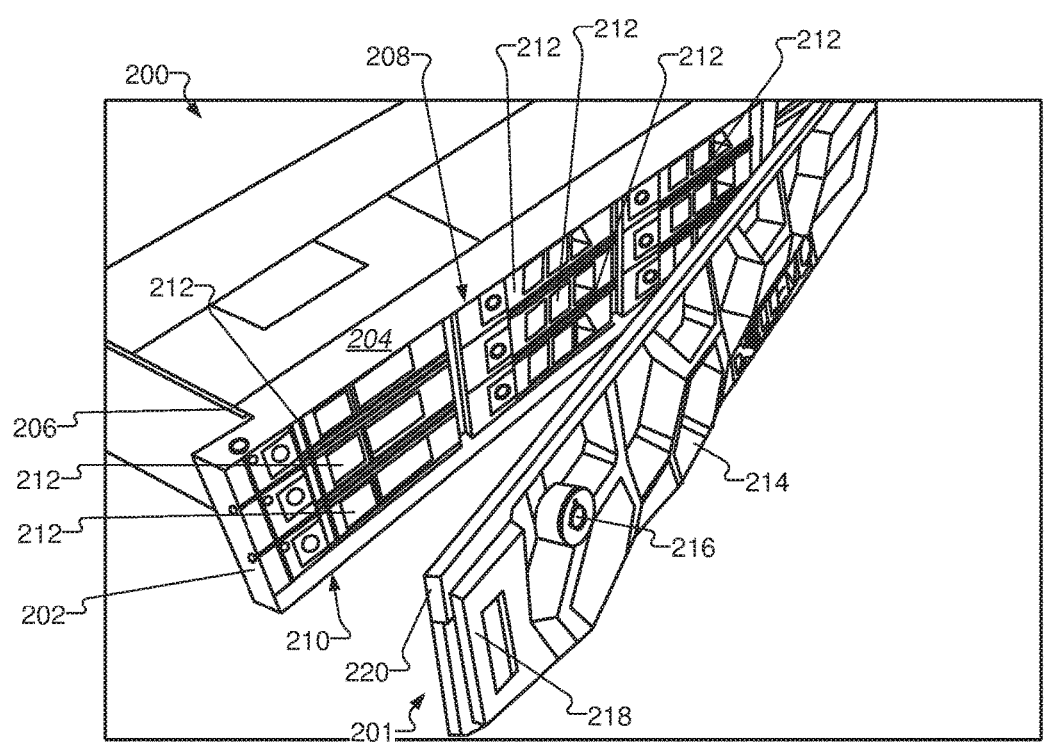
FIG. 2 illustrates a bezel locking system detached from an information handling system, in accordance with one embodiment of this disclosure.

FIG. 2 illustrates the three-dimensional structure of IHS 200 with BLS 201 detached from chassis 202 of IHS 200, in accordance with one embodiment of this disclosure. BLS 201 is configured to removably attach to the front panel 208 of chassis 202. The embodiment of IHS 200 illustrated in FIG. 2 is for illustration only, and the IHS 100 of FIG. 1 could have the same or similar configuration. Similarly, BLS 201 illustrated in FIG. 2 is for illustration only, and the bezel locking system 180 illustrated in FIG. 1 could have the same or similar configuration.

Chassis 202 of IHS 200 includes a top panel 204, side panels 206, an open front panel 208, and a bottom panel 210. Chassis 202 houses internal components 212, such as electronic components and mechanical components, of IHS 200. That is, functional compute components (namely, internal components 212) encased in the external casing (namely, chassis 202) form IHS 200. In the example shown, the internal components 212 are arranged in a 3×3 array. As examples, the internal components 212 could include hard drives, communication ports, flash drives, reset buttons, or other server components, without limitation. IHS 200 includes internal components 212 accessible through open front panel 208.

Bezel locking system 201 provides a physical layer of security to internal components 212, by restricting access through open front panel 208. BLS 201 includes a bezel 214, a bezel lock 216, a release button 218, and one or more latches 220.

The bezel 214 removably attaches to open front panel 208 of the server chassis (for example, a front panel) of the IHS 200 in order to prevent removal of internal components 212 from the IHS 200 through the opening of the front panel 208 of the server chassis 202. The structure and shape of bezel 214 is configured to fit or mate with an interior surface of the open front panel 208. Portions of the bezel 214, such as a vertex or protrusion, fit into or mate with one or more holes or recesses in the interior surface of the front panel 208. That is, the bezel 214 is a structure used to close the opening of the server chassis's open panel. Once the bezel 214 is installed, or otherwise fitted within the opening of the server chassis's open panel, the bezel 214 may be located adjacent to internal components of the server, in a similar manner as closed panels of server chassis.

The bezel lock 216 controls whether the latches 220 can be operated, and thus controls whether the bezel 214 can be attached to or detached from the server chassis 202. The bezel lock 216 has two orientations: locked and unlocked. In the locked orientation, the bezel lock 216 restricts removal of the bezel 214 from the server chassis 202, by blocking or otherwise constraining the latch 220 from moving from the engaged position to the disengaged position. On the other hand, in the unlocked orientation, the bezel lock 216 allows removal of the bezel 214 from the server chassis 202, by unblocking or otherwise allowing an operation of the latch 220 moving from the engaged position to the disengaged position. As described more particularly, below, the bezel lock 216 includes mechanical components that have a specifically designed shapes and arrangements to enable its functions.

Latches 220 operate to attach the bezel 214 to the chassis 202 and to detach the bezel 214 from the chassis. The latches 220 retain the bezel 214 adjacent to the front panel 208 of the server chassis 202 when the latches 220 are engaged. The bezel 214 is detached from the server chassis 202 when the latches 220 are disengaged. Latches 220 can be in a retracted position within the perimeter edge of bezel or can extend beyond the perimeter of bezel 214 to engage into latch receiving affordances of chassis 202 or front panel 208. The perimeter of bezel's 214 opening of the front panel 208 has a dimension that enables the bezel 214 to be inserted into the front panel 208 when latches 220 are in the retracted position. Although a user's hand is removed from view and not shown as performing actuation of the release button 218, in FIG. 2, release button 218 is actuated, and as a result, the latches 220 are retracted within the perimeter of the bezel 214. The retracted state of the latch 220 enables the bezel 214 to fit within the opening of the front panel 208. The retracted state reduces the chances of the latch 220 colliding with the exterior edges of front panel 208, which would prevent the insertion of BLS 201 as the latch 220 extended beyond the perimeter of the bezel and the opening of front panel 208.

On the other hand, when the release button 218 is not actuated, the result is that the latch 220 protrudes or otherwise extends beyond the beyond the perimeter of the bezel 214. The protruded state of the latch 220 either: (i) prevents the detached bezel 214 from fitting within the opening of the front panel 208, or alternatively, (ii) extends into a receiving affordance (e.g., a hole 302 of FIG. 3) within chassis 202 or otherwise engages with the chassis 202 in order to retain the bezel 214 fitted within the opening of the front panel 208. In certain embodiments, when the bezel 214 fits within the opening of the front panel 208, the bezel 214 is in a position adjacent to the front panel 208, such that the back surface of the bezel 214 is parallel with a front surface of the external surface of the front panel 208. In certain embodiments, when the bezel 214 fits within the opening of the front panel 208, the bezel 214 is in a position adjacent to the front face of the internal components 212, such that the back surface of the bezel 214 is parallel with a front surface of the internal components 212.

Figure 3:
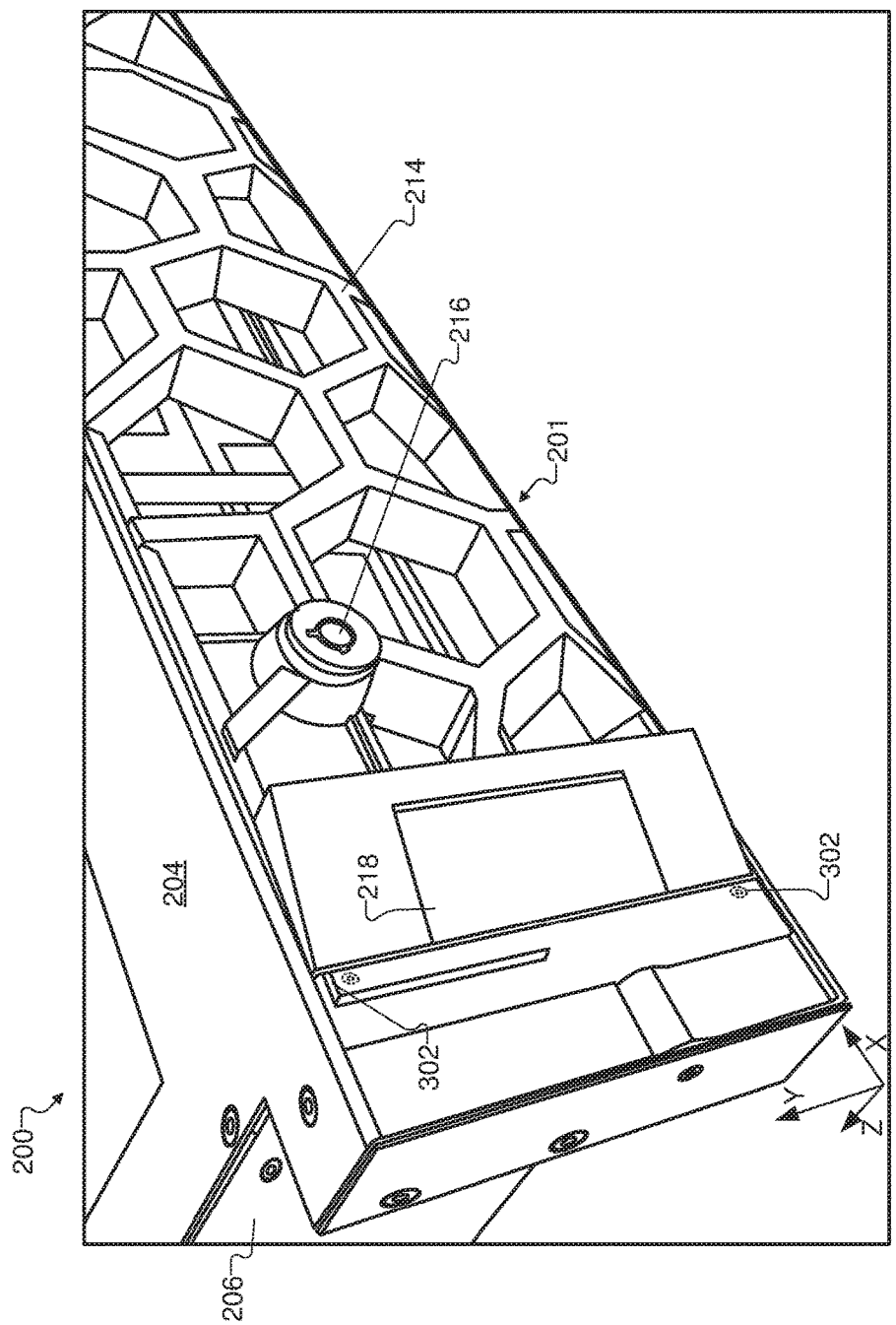
FIG. 3 illustrates the bezel locking system of FIG. 2 attached to the information handling system.

FIG. 3 illustrates the BLS 201 of FIG. 2 attached to the information handling system 200. More particularly, the bezel 214 fits within the opening of the front panel 208. The latches 220 are engaged with the chassis 202 (within the latch receiving affordances), and as a result, hidden from view. The release button 218 is not actuated.

The BLS 201 includes multiple components that move in different directions, as described in greater detail below. These directions are referenced using the three axes shown in FIG. 3, which identify a transverse direction (indicated by the horizontal X-axis), a vertical direction (indicated by the Y-axis), and a longitudinal direction (indicated by the Z-axis). Accordingly, the bottom panel of the server (which is resting on its bottom panel as depicted in FIG. 3) provides a flat horizontal plane while the left and right side panels provide vertical planes. It is appreciated that the three directions and the movements described herein relative to those directions depends on the orientation of the server. For example, when the server is placed vertically upright on one of its side panels (as opposed to on its bottom panel) such that the bottom and top panels are now vertical planes, the movements in the horizontal direction and vertical direction would be the inverse of when the server was placed on its bottom panel. That is, when the server is placed upright on one of its side panels (as opposed to on its bottom panel), the transverse direction would be indicated by the vertical Y-axis.

Figure 4:
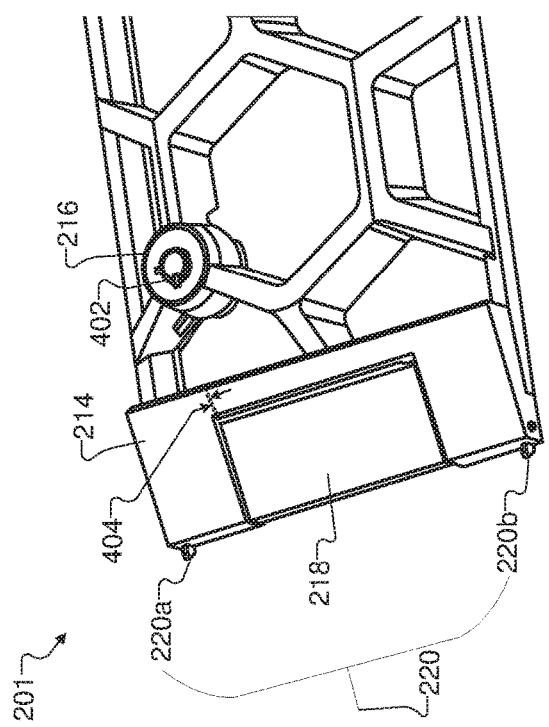
FIG. 4 illustrates a bezel locking system of FIG. 2 in a locked orientation, according to one or more embodiments of this disclosure.

FIG. 4 illustrates the BLS 201 of FIG. 2 in a locked orientation, according to one or more embodiments of this disclosure. The bezel lock 216 includes a keyhole 402 that is configured to receive a key. The locking mechanism within bezel lock 216 allows the inserted key to rotate (for example, 90°) between a locked orientation and an unlocked orientation. In certain embodiments, the keyhole 402 includes a notch that allows the key to be inserted or removed only when bezel lock 216 has reached the locked or unlocked orientation, and prevents removal of the key when bezel lock 216 is in between the locked and unlocked orientations.

Figure 5:
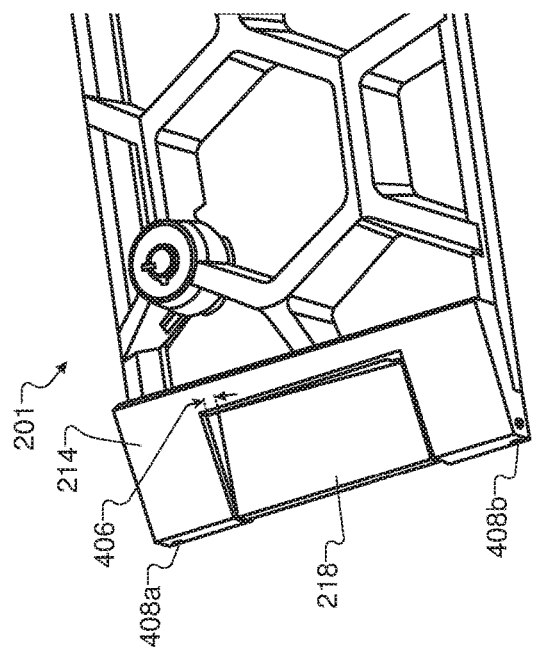
FIG. 5 illustrates the bezel locking system of FIG. 2 in an unlocked orientation with an actuated release button, according to one or more embodiments of this disclosure.

In FIG. 4, release button 218 is not actuated. That is, the release button 218 is in its default position, angled up (shown from left to right) to its highest angle, as indicated by a zero-displacement minimum-distance 404 between the bezel 214 and the release button 218. In the example shown, the release button 218 can be actuated by being pressed by a user, which causes the release button 218 to depress down to a lower angle, as shown in FIG. 5 by the positive-displacement distance 406 between the bezel 214 and the release button 218. As described in more detail below, if the user tries to actuate (namely, by pressing) the release button 218 while the bezel lock 216 is in the locked orientation, then the release button will not depress. Also, as described in more detail below, the release button 218 will only depress while the bezel lock 216 is in the unlocked orientation, in which orientation the release button 218 will actuate if the user presses it. In alternate embodiments, the release button can be actuated by applying a force other than pressing down, for example by pulling or twisting or simply touching.

The latches 220 can include an upper latch 220a and a lower latch 220b. In the embodiment shown, the upper and lower latches 220a-220b are identical, but upper and lower latches 220a-220b could have different shapes or dimensions in other embodiments. As shown, the upper and lower latches 220a-220b are in the protruded state, extended beyond the perimeter of the bezel 214, as a result of the bezel lock 216 being in the locked orientation. When the bezel 214 has been fitted or otherwise installed into the opening of the front panel 208 of the server chassis 202, and the bezel lock 216 placed in the lock position, the upper and lower latches 220a-220b are engaged with a server chassis 202 such that the upper latch 220a is disposed vertically above the lower latch 220b.

FIG. 5 illustrates the BLS 201 of FIG. 4 in an unlocked orientation with an actuated release button 218. As a result of the BLS 201 being in the unlocked orientation, the upper and lower latches 220a-220b are in the retracted state and hidden from view, being retracted within the perimeter of the bezel 214. The bezel 214 includes latch openings 408a-408b through which the upper and lower latches 220a-220b extend and retract.

Figure 6:
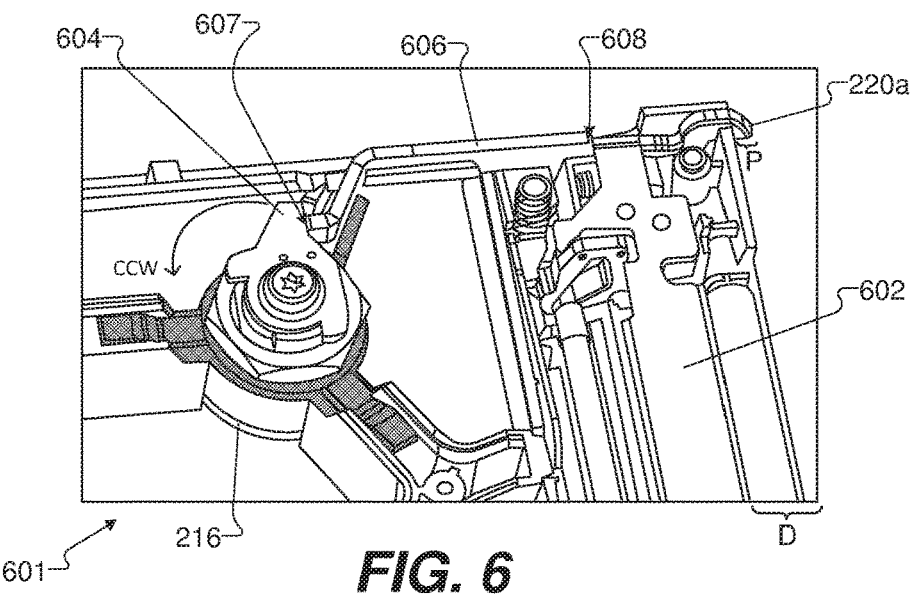
FIG. 6 illustrates a bezel locking system including a cam bracket in a locked orientation, from an inside point of view, according to one embodiment of this disclosure.
Figure 7:
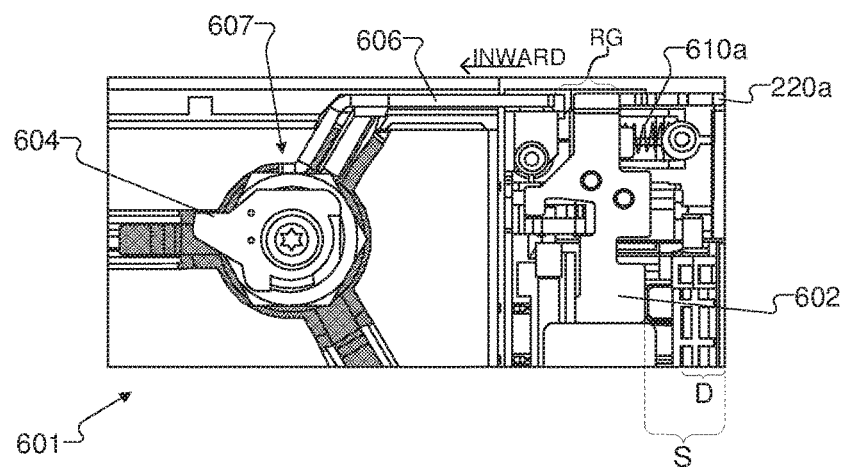
FIG. 7 illustrates the bezel locking system of FIG. 6 including the cam bracket in an unlocked orientation, according to one or more embodiments of this disclosure.

A view of the back of the BLS 601 is shown in FIGS. 6 and 7. BLS 601 includes a latching bracket 602, which slides in a transverse direction from a default engaged position (shown in FIG. 6) to a disengage position (shown in FIG. 7). FIG. 6 illustrates a BLS 601 including a cam bracket in a locked orientation, from an inside point of view, according to one embodiment of this disclosure. The embodiment of the BLS 601 illustrated in FIG. 6 is for illustration only, and the BLS 201 illustrated in FIG. 2 could have the same or similar configuration, and as such, the different views in FIGS. 2-14 could all represent the same BLS. Note that while two BLSs, 201 and 601, are shown, features of one BLS could be used in the other BLS. For instance, BLS 601 (shown in FIG. 6) could include the bezel lock 216, and release button 218 on the front of bezel 214 (in FIG. 2) and could further include the latches 220 (upper latch 220a and a lower latch 220b). As another example, the BLS 201 (in FIG. 2) could include the components 602-610a shown in FIGS. 6-7.

BLS 601 includes a latching bracket 602, which slides in a transverse direction from a default engaged position (shown in FIG. 6) to a disengage position (shown in FIG. 7). When the release button 218 is not actuated, the latching bracket 602 is in the default engaged position, and as a result, the latches 220 protrude beyond the perimeter of the bezel (as indicated by the protrusion distance P). Also, when the release button is not actuated, a minimum default separation (as indicated by the distance D) exists between the flat bar portion of latching bracket 602 and the end of the bezel 214. On the other hand, when the release button 218 is actuated, the latching bracket 602 is in the disengaged position, and as a result, the latches 220 are retracted within the perimeter of the bezel (as shown by no protrusion in FIG. 7). Also, when the release button 218 is actuated, there is a specified separation (as indicated by the distance S, which is greater than distance D) between the flat bar portion of latching bracket 602 and the end of the bezel. The latching bracket 602 includes a flat bar that extends along the back of the locking system 601 from the upper latch 220a to the lower latch 220b. In the embodiment shown in FIGS. 6-7, the latching bracket 602 operates as a single unitary component, integrating the upper latch 220a, the flat bar, and the lower latch 220*b*. The latching bracket 602 enables each latch (namely, the upper and lower latches 220*a*-220*b*) to extend and retract at substantially the same time. Each latch 220 is configured to hook or unhook the front panel (for example, front panel 408) of the chassis (for example, chassis 202) at substantially the same time.

The bezel lock 216 includes a rotating cam bracket 604 that is configured to rotate from a locked orientation to an unlocked orientation. In the example shown, the cam bracket 604 can rotate ninety degrees (90°) counter clockwise (CCW) from the locked orientation in FIG. 6 to the unlocked orientation in FIG. 7. The cam bracket 604 can be fixed (for example by a screw, bolt, or mechanical fastener) to the axis about which the bezel key turns within the keyhole of the bezel lock 216. In the locked orientation, the cam bracket 604 prevents the latching bracket 602 from moving in the transverse direction, and as a result, prevents the protruded latches 220 from retracting into the perimeter of the bezel 214, through the latch openings 408*a*-408*b* (described above with reference to FIG. 5). The shape of the cam bracket 604 includes a rigid flange configured to abut (for example, in surface-to-surface contact) a convert bracket 606 at a first transverse end 607, when the cam bracket 604 is in the locked orientation. By abutting the convert bracket 606, the cam bracket 604 constrains the convert bracket 606 from moving inward in a transverse direction toward the center of the bezel. As a technical advantage, while in the locked orientation, the cam bracket 604 not only provides a rigid physical block, blocking the convert bracket 606 from moving inward, but also blocks other components (namely, the latching bracket 602) of the BLS 601 from moving inward, specifically, inward beyond a second transverse end 608 of the convert bracket 606.

The BLS 601 includes the convert bracket 606 that slideably secures the latching bracket 602 to the frame of the chassis 202, when the convert bracket 606 is in a locked position. The length of the convert bracket 606 extends between its first transverse end 607 and second transverse end 608. The shape of the convert bracket 606 is that of two parallel arms connected by an acute-angled (for example, 45°) arm that has rounded elbows. The first parallel arm of the convert bracket 606 includes the first transverse end 607. The second parallel arm of the convert bracket 606 includes the second transverse end 608. The second parallel arm of the convert bracket 606, which is collinear with the transverse path of movement of the upper latch 220*a*, is longer than the first parallel arm of the convert bracket 606. The convert bracket 606 is disposed between the latching bracket 602 (at the second transverse end 608) and the cam bracket 604 (at the first transverse end 607). When convert bracket 606 is in the engage position, the first transverse end 607 abuts the cam bracket 604 while the second transverse end 608 abuts the latching bracket 602. By abutting the latching bracket 602 and cam bracket 604 on opposite ends 607 and 608, the convert bracket 606 is confined (in the transverse direction) between both latching and cam brackets 602 and 604 in the locked orientation.

FIG. 7 illustrates the BLS 601 of FIG. 6 including the cam bracket 604 in an unlocked orientation. The convert bracket 606 is configured to slide, in the transverse direction, a length (namely, length RG) of a release gap. The latching bracket 602 is configured to slide from an engage position to a disengage position. When the convert bracket 606 is in the engage position, at least one latch 220 extends beyond the perimeter of the bezel 214. On the other hand, when the convert bracket 606 is in the disengage position, the latches 220 are retracted inward within the perimeter of the bezel 214.

As shown in FIG. 7, the latching bracket 602 is in the disengage position, and the latches 220 are in the retracted state, indicating that the release button 218 remains currently actuated. For example, after the cam bracket 604 rotated to the unlocked orientation, a user actuated the release button 218, which forced the latching bracket 602 to both slide inward and apply a force (inward, in the transverse direction) against the second transverse end 608. Rotating the cam bracket 604 to the unlocked orientation unblocks the convert bracket 606 and thereby allows the convert bracket 606 to be forced inward, which is what is depicted in FIG. 7. That is, the cam bracket 604 is disposed out of the horizontal path of the convert bracket 606 when the cam bracket 604 is in the unlocked orientation.

The BLS 601 includes two springs 610*a*-610*b* (reference 610*b* is shown FIG. 11) that operate in the transverse direction. The springs 610*a*-610*b* are located proximate to the upper and lower ends of the latching bracket 602. The springs 610*a*-610*b* apply a force to the latching bracket 602 based on actuation or non-actuation of the release button 218. Actuation of the release button 218 causes motion of latching bracket 602 in the inward direction. Release of the release button 218 (namely, non-actuation) causes motion of latching bracket 602 in the leftward direction, which the direct opposite of inward.

Figure 8:
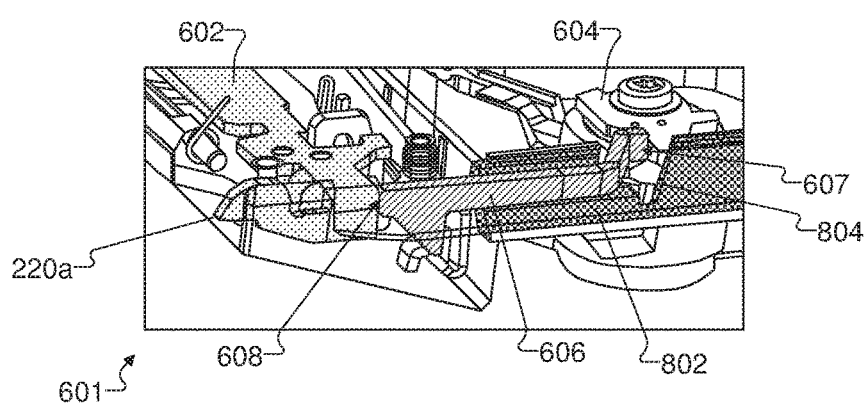
FIG. 8 illustrates a partial view of the top and back and left sides of the bezel locking system of FIG. 6 including the cam bracket in the locked orientation, from an outside point of view, according to one or more embodiments of this disclosure.

FIG. 8 illustrates a partial view of the top and back and left sides of the BLS 601 of FIG. 6 including the cam bracket 604 in the locked orientation, from an outside point of view. The convert bracket 606 abuts the latching bracket 602 and the cam bracket 604 on opposite ends 607 and 608. Accordingly, the latching bracket 602 is blocked or constrained from moving inward by the physical barrier of the convert bracket 606, and the convert bracket 606 is blocked or constrained from moving inward by the physical barrier of the cam bracket 604 in the locked orientation. As a technical advantage, the cam bracket 604 is strong enough to constrain inward movement of the combination of the latching bracket 602 and convert bracket 606, when the cam bracket 604 is in the locked orientation.

In certain embodiments, the bezel 214 includes a rail 802 with a notched stop 804, which is formed by a recessed notch in the rail 802. The rail 802 guides the transverse sliding movement of the convert bracket 606. The notched stop 804 allows an elbow portion of the acute-angled arm of the convert bracket 606 to slide, in the transverse direction, a length (namely, length RG) of a release gap, abutting opposing stop ends of the notch when in the locked or released positions.

Figure 9:
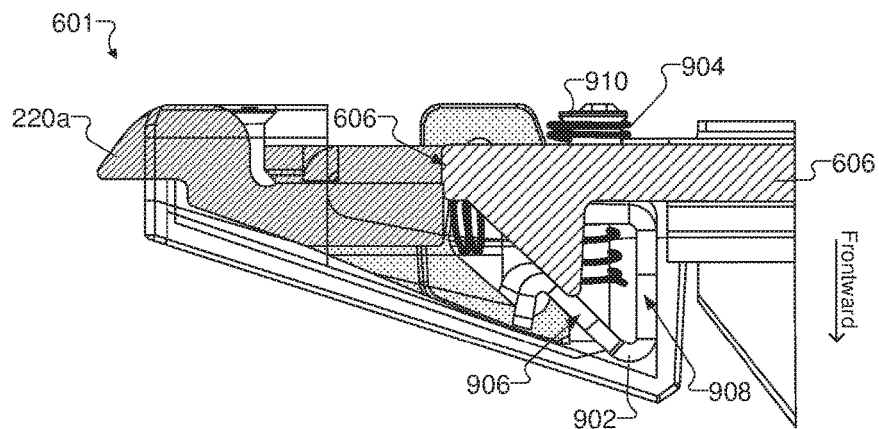
FIG. 9 illustrates a top view of the bezel locking system of FIG. 6 including a convert bracket in a locked position, according to one or more embodiments of this disclosure.

FIG. 9 illustrates a top view of the BLS 601 of FIG. 6 including a convert bracket in a locked position and the bezel lock 216 in the locked orientation. The shape of the convert bracket 606 includes a triangular protrusion that protrudes from the longer parallel arm of the convert bracket 606 in a longitudinal direction (namely, frontward). The triangular protrusion of the convert bracket 606 switches the direction in which force is conveyed by alternately (1) receiving force in the transverse direction and conveying that force to be applied in the longitudinal direction; and (2) receiving a force in the longitudinal direction and conveying that force to be applied in the transverse direction.

The BLS 601 includes a seesaw bracket 902 that is configured to rock about a fulcrum (reference numbers 1304*a*-1304*b* in FIG. 13) in cooperation with a sliding motion of the convert bracket 606 and the operation (namely, compression and expansion) of a spring 904. The seesaw bracket 902 includes an L-shaped lower end (hidden from view) and an upper end 906 (visible in FIGS. 9 and 10) that is nearby the convert bracket 606. As the upper end 906 of the seesaw bracket 902 rocks or otherwise moves in a longitudinal direction (namely, frontward), the lower end of the seesaw bracket 902 rocks or otherwise moves in the opposite longitudinal direction (namely, backward), and vice versa.

The upper end 906 of the seesaw bracket 902 is configured to be pressed in the longitudinal direction (for example, forward) by the convert bracket 606, when the convert bracket 902 is in the locked position. The upper end of the seesaw bracket 902 includes an angled arm that matches the slope of a triangular protrusion of the convert bracket 606 and includes a straight longitudinal arm 908. Together, these arms form the vertex of triangular hole configured to mate with the vertex of the triangular protrusion of the convert bracket 606, when the convert bracket 606 is in the released position. The vertex triangular protrusion of the convert bracket 606 separates from the vertex triangular hole of the upper end of the seesaw bracket 902, when the convert bracket 606 is in the locked position. Accordingly, when the convert bracket 606 is in the locked position, the vertex of the triangular protrusion of the convert bracket 606 applies a force on the angled arm of the upper end 906 of the seesaw bracket 902 in the frontward direction, thereby pushing the upper end 906 of the seesaw bracket 902 to move or otherwise rock frontward. The frontward force applied to the upper end 906 of the seesaw bracket 902 compresses the spring 904 by moving the back end of the spring 904 in a longitudinal direction (namely, frontward) along the shaft 910. On end of the spring the bezel 214 is at the bezel, and the other end of the spring 904 is at the seesaw bracket 906.

In certain embodiments, the convert bracket 606 can remain in the locked position independent of the locked or unlocked orientation of the cam bracket 604. In other embodiments, the convert bracket 606 automatically retracts to the released position when the cam bracket 604 of the bezel lock 216 rotates to the unlocked orientation based on an operation of the spring 904. That is, the spring 904 forces the upper end 906 of the seesaw bracket in a longitudinal direction (namely, backward), when the bezel lock 216 rotates from the locked orientation to the unlocked orientation.

Figure 10:
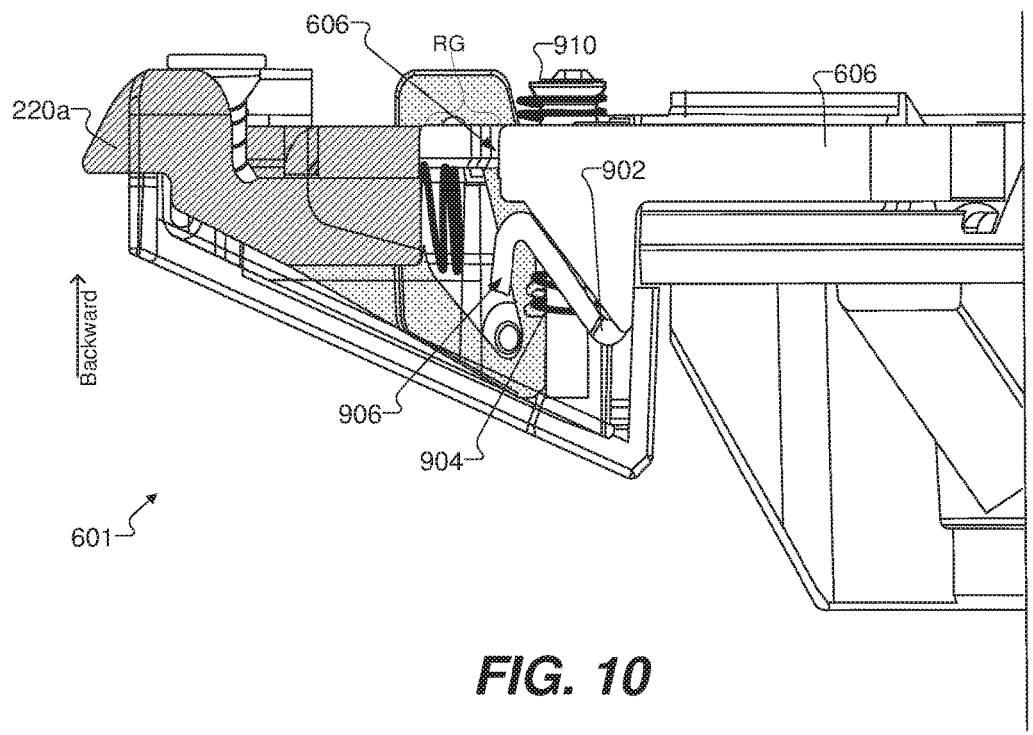
FIG. 10 illustrates a side view of the bezel locking system of FIG. 9 including the convert bracket in a release position, according to one or more embodiments of this disclosure.

The locked/released position of the convert bracket 606 (namely, locked or release) indicates the locked/unlocked orientation of the bezel lock 216, and thereby also indicates whether it is possible for a user to actuate the release button 218 if the user tries to perform the actuation. Specifically, in embodiments that include the springs 610a-610b, the position of the convert bracket 606 alone is not sufficient to determine whether user can or cannot actuate the release button 218. By way of comparing similarities, both FIGS. 9 and 10 show the upper latch 220a is in the protruded state, indicating that the release button 218 is not actuated. But, by way of comparing difference, in FIG. 9, wherein the bezel lock 214 is in the locked orientation, the user cannot actuate the release button 218 even if the user tries to perform the actuation. The reason is that when the bezel lock 214 is in the unlocked orientation, then the convert bracket 606 is in the locked position wherein it blocks the latching bracket 602 from moving inward and thereby also physically blocks the release button 218 (second shaft 1104 of FIG. 11) from actuating.

FIG. 10 illustrates a side view of the BLS 601 of FIG. 9 including the convert bracket 606 in a release position and the bezel lock 216 in the unlocked orientation. When the convert bracket 606 is in the release position, the convert bracket 606 does not block motion of the latching bracket 602, and thereby also does not block the release button 218 from actuation. As shown in FIG. 10, the upper latch 220a is in the protruded state, indicating that the release button 218 is not actuated. That is, when the bezel lock 214 is in the unlocked orientation, a user can operate the release button 218 to actuate or not actuate the release button 218, and as a result, operate the latching bracket 602 to disengage from or engage with the chassis 202, respectively.

The upper end 906 of the seesaw bracket 902 is configured to rock or otherwise move backward as the bezel lock 216 rotates to the unlocked orientation. The convert bracket applies a force against the seesaw bracket 902 to trigger backward or frontward motion of the upper end 906 of the seesaw bracket 902, based on the respective released or locked position of the convert bracket 606. That is, as the bezel lock 216 rotates to the unlocked orientation, the bezel lock 216 unblocks the convert bracket 606 from sliding toward the released position, more specifically, allowing the convert bracket 606 to slide toward the released position). The spring 904, by decompressing as the bezel lock 216 rotates to the unlocked orientation, applies a backward (surface-to-surface) force against the upper end 906 of the see saw bracket 902, and consequently rocks the upper end 906 backward. As described above, the vertex of the triangular hole formed in the upper end 906 of the seesaw bracket 902 mates with the vertex of the triangular protrusion of the convert bracket 606, when the convert bracket 606 is in the released position, as shown in FIG. 10. That is, as the convert bracket 606 slides from the locked position to the released position, the spring 904 decompresses.

Figure 11:
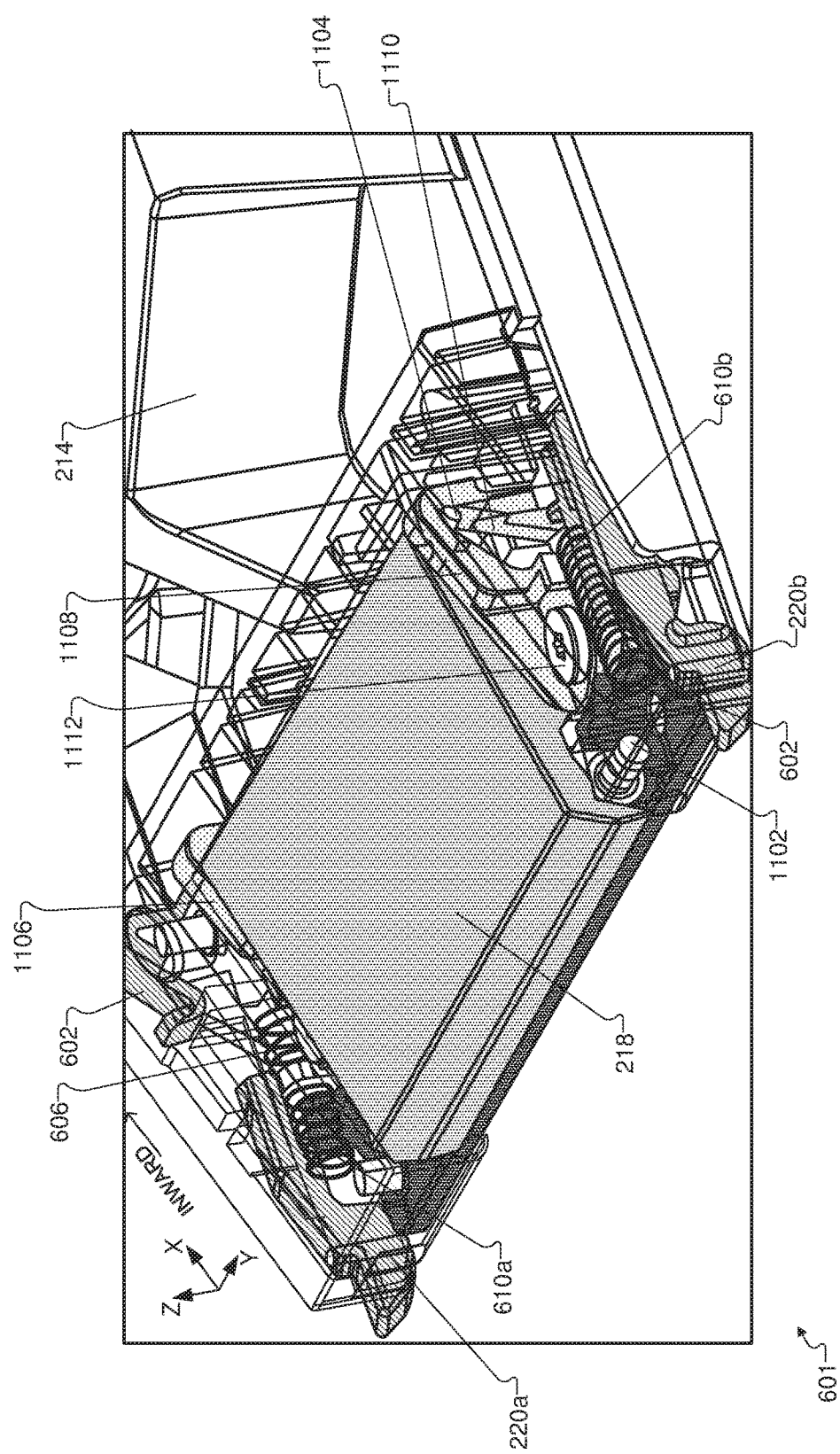
FIG. 11 illustrates the bezel locking system of FIG. 6 including a release button that is not actuated, according to one embodiment of this disclosure.

FIG. 11 illustrates a BLS 601 of FIG. 6 including a release button 218 that is not actuated, according to one embodiment of this disclosure. The BLS 601 includes multiple components that move in different directions, as described herein with reference to the three axes shown in FIG. 11. The three axes shown in FIG. 11 identify a transverse direction (namely, indicated by the horizontal X-axis), a vertical direction (namely, indicated by the Y-axis), and a longitudinal direction (namely, indicated by the Z-axis). Accordingly, the back surface of the BLS 601 (which is resting on its back panel as depicted in FIG. 11) provides a flat horizontal plane while the left and right side panels provide vertical planes. It is appreciated that the three directions and the movements described herein relative to those directional depends on the orientation of the bezel 214 or BLS 601. For example, when the BLS 601 is placed vertically upright on one of its top or bottom panels (as opposed to on its back panel) such that the bottom and top panels now horizontal planes, the movements in the horizontal direction and vertical direction would be the inverse of when the bezel was placed on its back panel. That is, when the bezel is placed upright on one of its top or bottom panels (as opposed to on its back panel), the transverse direction would be indicated by the horizontal X-axis and the longitudinal direction would be indicated by the Y-axis.

Figure 14:
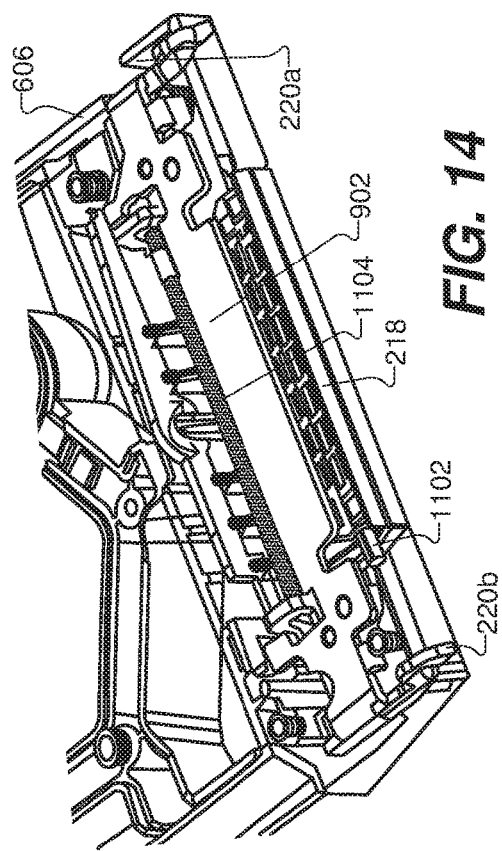
FIG. 14 illustrates a back view of the bezel locking system of FIG. 12 in the unlocked orientation including the non-actuated release button, according to one or more embodiments of this disclosure.

The release button 218 has a rectangular shaped portion with three sets of opposing sides, namely, front and back, top and bottom, and left and right. The release button 218 could have any suitable shape, and is not limited to being rectangular. The release button 218 includes two rigid shafts 1102 and 1104 that extend in a vertical direction beyond the top and bottom sides of the rectangular portion. In certain embodiments, the shaft extends across the length of the back side of the rectangular shaped portion of the release button 218 (such as shaft 1104 as illustrated in FIG. 14), but in other embodiments, the shaft 1102 could simply extend from the top and bottom sides of the rectangular shaped portion of the release button 201 without extending across the back side of the rectangular shaped portion of the release button 201 (such as shaft 1102 as illustrated in FIG. 14). The rigid shafts 1102 and 1104 are integrated with the rectangular portion of the release button 218 and are immobile relative to the rectangular portion. The view in FIG. 11 shows bottom ends of the first shaft 1102 and second fixed shaft 1104 protruding from the bottom side of the rectangular portion of the release button 218. The first shaft 1102 is disposed proximate to the left side of the bezel 214. During operation of the release button 218, the first shaft 1102 remains in a fixed location relative to other components of BLS 601.

Figure 12:
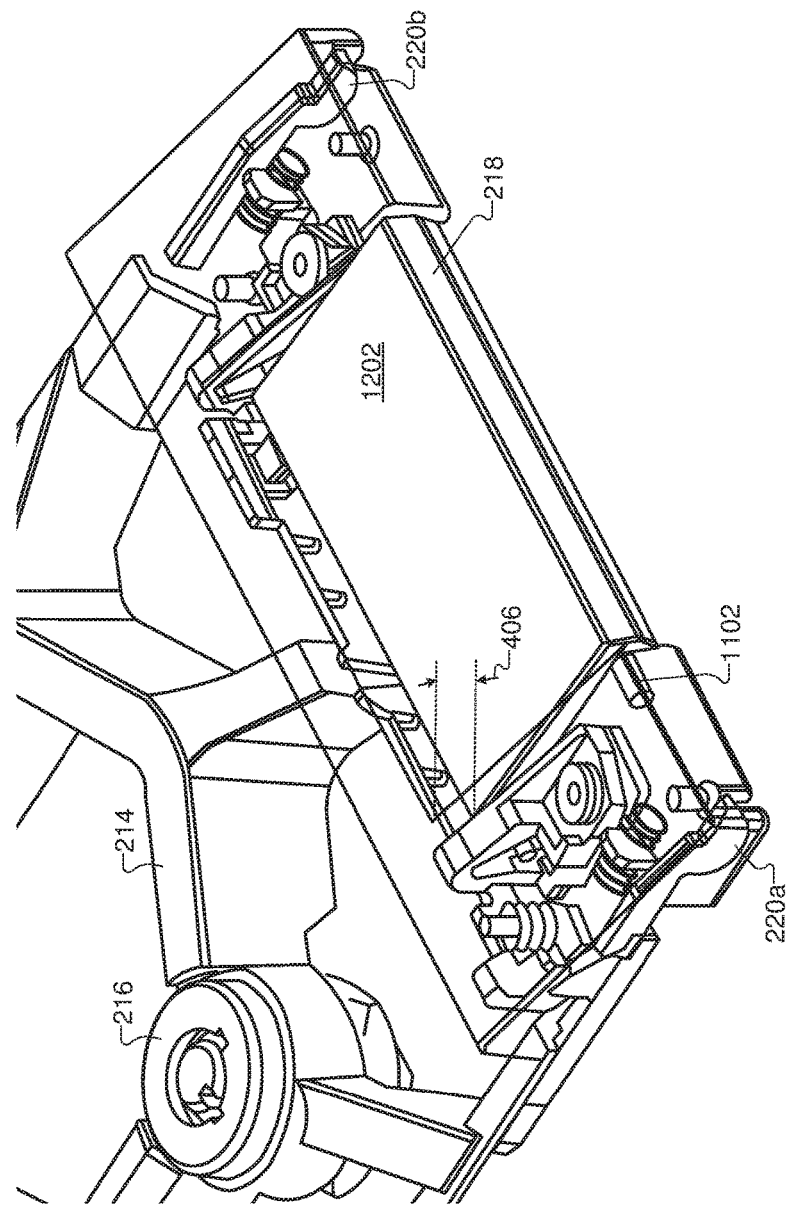
FIG. 12 illustrates a bezel locking system in an unlocked orientation including a release button that is actuated, according to one embodiment of this disclosure.

The second shaft 1104 is disposed proximate to the right side of the release button 218. The top end (hidden from view) of the second shaft 1104 is configured to be inserted within an angled slot of the upper cam holder 1106 of the BLS 601. The bottom end of the second shaft 1104 is configured to be inserted within an angled slot of the lower cam holder 1108 of the BLS 601. When the release button 218 is not actuated, the second shaft 1104 is disposed at the inward-front end of the angled slot 1110, and the latches 220a-220b are in the protruded state. When the release button 218 is actuated (as shown in FIG. 12), the second shaft 1104 is disposed at the back end of the angled slot 1110, and the latches 220a-220b are in the retracted state. The front end and back end of the angled slot 1110 are opposite ends of the length of the inner surface of the angled slot 1110.

The cam holders 1106 and 1108 are attached to the front surface of the latching bracket 602 by a mechanical fastener 1112 (for example, a bolt). The latching bracket 602 and cam holders 1106 and 1108 move as a unit (namely, in the transverse direction) based on operation of the release button 218. A user actuates the release button 218 by applying a force in the longitudinal direction. The applied longitudinal force causes the second shaft 1104 to apply a longitudinal force against the inner surfaces of the angled slots 1110 of the cam holders 1106 and 1108. The shape of the angled slot 1110 conveys a portion of the second shaft's 1104 force into the transverse direction (namely, inward), and as a result, forces the cam holder 1106 to move in the transverse direction (namely, inward) as the second shaft 1104 is guided (along the inner surface of the angled slots 1110) to the back of the cam holder 1106. The release button 218 is configured to unhook each latch 220a-220b from the front panel 208 of the chassis 202 by forcing the cam holders 1106 and 1108, in combination with the mechanically fastened latching bracket 602, to move in the transverse direction (namely, inwardly).

FIG. 12 illustrates a BLS in an unlocked orientation including a release button 218 that is actuated, according to one embodiment of this disclosure. As described above, the release button 218 can be actuated by being pressed by a user, which causes the release button 218 to depress down to a lower angle, as shown in FIGS. 5 and 12 by the positive-displacement distance 406 between the bezel 214 and the front surface 1202 of release button 218. As shown, the top end of the first shaft 1102 extends from the top side of the rectangular portion of the release button 218.

Figure 13:
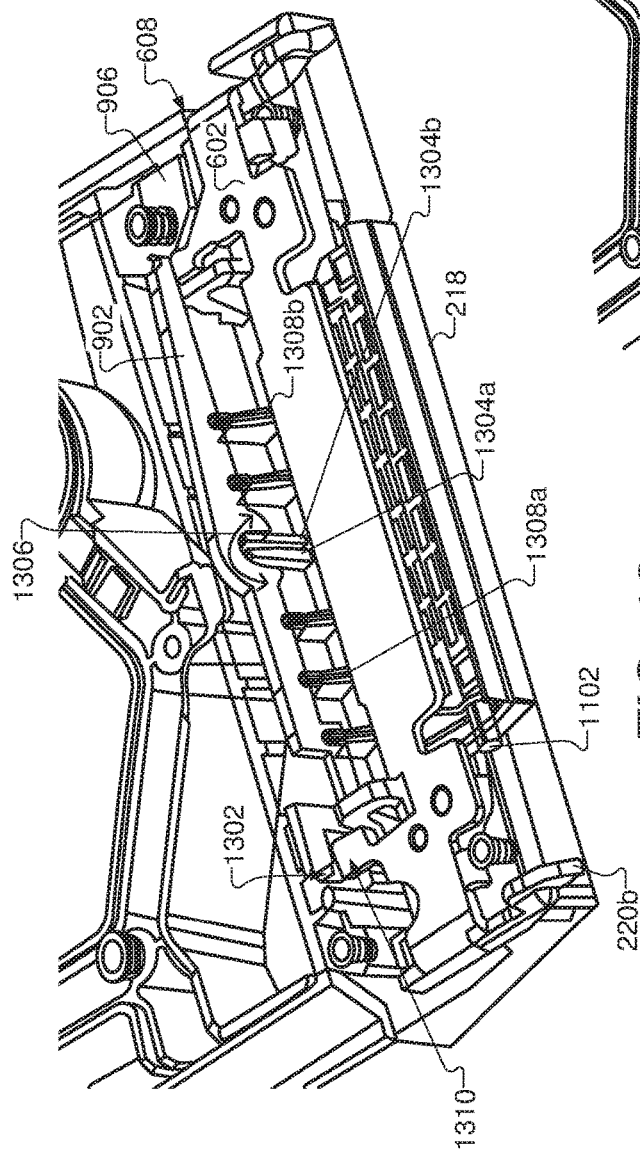
FIG. 13 illustrates a back view of the bezel locking system of FIG. 12 in the locked orientation including the actuated release button, according to one or more embodiments of this disclosure.

FIG. 13 illustrates a back view of the BLS of FIG. 12 in the locked orientation with the release button 218 actuated. FIG. 14 illustrates a back view of the BLS of FIG. 12 in the unlocked orientation with the release button not actuated.

The seesaw bracket 902 includes a connecting bar portion that extends between its L-shaped lower end 1302 and an upper end 906. The center of the connecting bar portion includes a recess that mates with the crests of two ribs 1304a-1304b. The two ribs 1304a-1304b form a fulcrum about which the seesaw bracket 902 rocks. The seesaw bracket 902 rocks in the rocking motion directions of the arrow 1306. Any suitable shape could be used for the fulcrum. The BLS includes additional ribs 1308a-1308b that hold the seesaw bracket 902 (for example, the connecting bar portion) in a fixed Y-Z plane, in order to resist shift of the seesaw bracket out of its designed position.

The flange of the L-shaped lower end 1302 is configured to block, prevent, or otherwise counteract against inward motion of the latching bracket 602, when the BLS is in the locked orientation. That is, the flange of the L-shaped lower end 1302 rocks in a longitudinal direction (namely, backward) when the BLS is in the locked orientation. Also, the flange of the L-shaped lower end 1302 rocks in the opposite direction (namely, frontward) to unblock inward motion of the latching bracket 602, when the release button 218 is actuated and while the BLS is in the unlocked orientation (shown in FIG. 14). In certain embodiments, the seesaw bracket is configured to rock based on movement of the convert bracket 606, such that the lower end 1302 of the seesaw bracket blocks inward motion of the latching bracket when the convert bracket 606 is in the locked position, and such that the lower end 1302 unblocks inward motion of the latching bracket when the convert bracket 606 is in the released position.

The second transverse end 608 of the convert bracket 606 abuts an upper end of the latching bracket 602 when the latches 220a-220b are in the retracted state. Concurrently at substantially the same time, the L-shaped lower end 1302 of the seesaw bracket 902 abuts a proximate portion 1310 of the latching bracket 602.

FIG. 15 illustrates a method 1500 for manufacturing a BLS for an Information Handling System (IHS), according to one embodiment of this disclosure. For example, the method 1500 can be executed by manufacturing a bezel 214 (as shown in FIGS. 2-14) and securing it to the IHS 100, 200 (as shown in FIGS. 1-2). The method 1500 includes providing a BLS, such as the BLS 180, 201, 601 as shown in FIGS. 1-2 and 6-14. The BLS according to embodiments of the present disclosure includes various components. In block 1506, the method 1500 includes providing a bezel 214. For example, block 1506 could include providing a bezel 214 that is configured to attach to a panel, such as an open front panel 208, of a server chassis 202. In another example, providing the bezel 214 could include ensuring that the dimensions of the bezel 214 fit within an open panel of a chassis 202. The chassis 202 can be a sever chassis that houses one or more server components, such as internal components 212 of an IHS 100, 200. In block 1508, the method 1500 includes providing a convert bracket that slideably secures a latching bracket 602 of the bezel 214 to a frame of the server chassis 202 when the convert bracket is in a locked position. For example, providing the convert bracket could include placing the convert bracket along a rail within the bezel, such that a second parallel arm of the convert bracket extends along a transverse path. As another example, providing the convert bracket could include configuring the convert bracket 606 to slide a length, RG, of a release gap along a horizontal or transverse path from the locked position of the convert bracket 606 to a released position of the convert bracket 606. In block 1510, the method 1500 includes providing a bezel lock 216 that is configured to restrict removal of the bezel 214 from the server chassis 202 when the bezel lock 216 is engaged (namely, with the chassis 202) in a locked orientation. As an example, providing the bezel lock 216 could also include configuring the bezel lock to restrict removal of the bezel 214 from the server chassis 202 when the bezel lock 216 is engaged in the locked orientation. As another example, providing the bezel lock 216 could also include providing and configuring a rotating cam bracket 604 to rotate from the locked orientation to an unlocked orientation. In block 1512, the method 1500 includes providing a latching bracket 602 of the BLS. The latching bracket 602 includes one or more latches 220, such as an upper latch 220a and a lower latch 220b. In block 1514, the method 1500 includes providing a seesaw bracket 902 of the BLS. In block 1516, the method 1500 includes providing a spring that is configured to pull the upper end of the seesaw bracket 902 forward (namely, in a longitudinal direction) when the cam bracket 604 rotates to the unlocked orientation, thereby automatically retracting the convert bracket to the released position. In block 1518, the method 1500 includes providing a release button 218 of the BLS. The release button 218 includes a release button shaft 1104 that is configured to insert within the angled slot 1110 of the upper and lower cam holders 1106 and 1104. The release button 218 is configured to unhook each latch 220a-220b from the panel (such as the open front panel 208) of the server chassis 202 by pushing the cam holders 1106 and 1104 and the latching bracket 602 in a transverse direction (namely, inward), thereby retracting the latches 220.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A bezel lock system comprising:
    a bezel configured to attach to a panel of a server chassis;
    a convert bracket that slideably secures a latching bracket of the bezel to a frame of the server chassis when in a locked position, the convert bracket configured to slide a length of a release gap along a transverse path from the locked position to a released position;
    a bezel lock configured to restrict removal of the bezel from the server chassis when the bezel lock is engaged in a locked orientation, the bezel lock including a rotating cam bracket configured to rotate from the locked orientation to an unlocked orientation;
    wherein in the locked orientation, the cam bracket constrains the convert bracket from moving inward on a transverse path by abutting the convert bracket, and the convert bracket is confined transversely between the latching bracket and the cam bracket in the locked orientation; and
    wherein in the unlocked orientation, the cam bracket is disposed out of the transverse path of the convert bracket, allowing the convert bracket to retract inward to the release position, allowing the bezel to detach from the panel.

2. The bezel lock system of claim 1, wherein the latching bracketing includes an upper latch and a lower latch, each latch configured to hook the panel of the server chassis at substantially the same time.

3. The bezel lock system of claim 1, wherein the latching bracket comprises at least one latch configured to retain the bezel adjacent the panel, the latching bracket configured to slide from an engage position in which the at least one latch extends beyond a perimeter of the bezel to a disengage position in which the at least one latch is retracted within the perimeter of the bezel, when forced inward.

4. The bezel lock system of claim 3, further comprising:
    a seesaw bracket configured to rock about a fulcrum in cooperation with a sliding motion of the convert bracket, the seesaw bracket comprising a lower end and an upper end;
    wherein the upper end is configured (i) to be pressed backward by the convert bracket being in the locked position and (ii) to rock forward when the cam bracket rotates to the unlocked orientation, thereby allowing the convert bracket to slide toward the released position; and
    wherein the lower end of the seesaw bracket is configured to constrain the lower latch from retracting further than the length of the release gap by abutting the latching bracket in the disengage position.

5. The bezel lock system of claim 4, further comprising:
    a spring configured to pull the upper end of the seesaw bracket forward when the cam bracket rotates to the unlocked orientation, thereby automatically retracting the convert bracket to the released position.

6. The bezel lock system of claim 1, wherein:
    the latching bracket is affixed to an upper cam holder and to a lower cam holder; and
    each cam holder includes an angled slot configured to receive a release button shaft that pushes the cam holder transversely inward when a release button is actuated.

7. The bezel lock system of claim 6, wherein the release button comprises a release button shaft configured to insert within the angled slot of the upper and lower cam holders, the release button configured to unhook each latch from the panel of the server chassis by pushing the cam holders and the latching bracket inward, thereby retracting the latches.

8. An Information Handling System (IHS) comprising:
    a server chassis housing one or more server components; and
    a bezel lock system comprising:
        a bezel configured to attach to a panel of the server chassis;
        a convert bracket that slideably secures a latching bracket of the bezel to a frame of the server chassis when in a locked position, the convert bracket configured to slide a length of a release gap along a transverse path from the locked position to a released position;
        a bezel lock configured to restrict removal of the bezel from the server chassis when the bezel lock is engaged in a locked orientation, the bezel lock including a rotating cam bracket configured to rotate from the locked orientation to an unlocked orientation;
        wherein in the locked orientation, the cam bracket constrains the convert bracket from moving inward on a transverse path by abutting the convert bracket, and the convert bracket is confined transversely between the latching bracket and the cam bracket in the locked orientation; and
        wherein in the unlocked orientation, the cam bracket is disposed out of the transverse path of the convert bracket, allowing the convert bracket to retract inward to the release position, allowing the bezel to detach from the panel.

9. The IHS of claim 8, wherein the latching bracketing includes an upper latch and a lower latch, each latch configured to hook the panel of the server chassis at substantially the same time.

10. The IHS of claim 8, wherein the latching bracket comprises at least one latch configured to retain the bezel against and adjacent the panel, the latching bracket configured to slide from an engage position in which the at least one latch extends beyond a perimeter of the bezel to a disengage position in which the at least one latch is retracted within the perimeter of the bezel, when forced inward.

11. The IHS of claim 10, wherein the bezel lock system further comprises:
- a seesaw bracket configured to rock about a fulcrum in cooperation with a sliding motion of the convert bracket, the seesaw bracket comprising a lower end and an upper end;
- wherein the upper end is configured (i) to be pressed backward by the convert bracket being in the locked position and (ii) to rock forward when the cam bracket rotates to the unlocked orientation, thereby allowing the convert bracket to slide toward the released position; and
- wherein the lower end of the seesaw bracket is configured to constrain the lower latch from retracting further than the length of the release gap by abutting the latching bracket in the disengage position.

12. The IHS of claim 11, further comprising:
a spring configured to pull the upper end of the seesaw bracket forward when the cam bracket rotates to the unlocked orientation, thereby automatically retracting the convert bracket to the released position.

13. The IHS of claim 8, wherein:
- the latching bracket is affixed to an upper cam holder and to a lower cam holder;
- the bezel lock system further comprises a release button; and
- each cam holder includes an angled slot configured to receive a release button shaft that pushes the cam holder transversely inward when the release button is actuated.

14. The IHS of claim 13, wherein the release button comprises the release button shaft configured to insert within the angled slot of the upper and lower cam holders, the release button configured to unhook each latch from the panel of the server chassis by pushing the cam holders and the latching bracket inward, thereby retracting the latches.

15. A method for manufacturing a bezel lock system for an Information Handling System (IHS), the method comprising: providing a bezel lock system by:
- providing a bezel configured to attach to a panel of a server chassis; providing a convert bracket and placing the convert bracket within the bezel such that the convert bracket slideably secures a latching bracket of the bezel in a protruded state to a frame when in a locked position;
- configuring the convert bracket to slide a length of a release gap along a transverse path from the locked position to a released position;
- providing and configuring a bezel lock to restrict removal of the bezel from the server chassis when the bezel lock is engaged in a locked orientation;
- including and arranging a rotating cam bracket within the bezel lock to rotate from the locked orientation to an unlocked orientation;
- wherein in the locked orientation, the cam bracket constrains the convert bracket from moving inward on a transverse path by abutting the convert bracket, and the convert bracket is confined transversely between the latching bracket and the cam bracket in the locked orientation; and
- wherein in the unlocked orientation, the cam bracket is disposed out of the transverse path of the convert bracket, allowing the convert bracket to retract inward to the release position, allowing the bezel to detach from the panel.

16. The method of claim 15, further comprising:
providing the latching bracket, the latching bracketing including an upper latch and a lower latch, each latch configured to hook the panel of the server chassis at substantially the same time.

17. The method of claim 15, wherein the latching bracket comprises at least one latch configured to retain the bezel against and adjacent the panel, the latching bracket configured to slide from an engage position in which the at least one latch extends beyond a perimeter of the bezel to a disengage position in which the at least one latch is retracted within the perimeter of the bezel, when forced inward.

18. The method of claim 17, further comprising:
providing and configuring a seesaw bracket to rock about a fulcrum in cooperation with a sliding motion of the convert bracket, the seesaw bracket comprising a lower end and an upper end;
- wherein the upper end is configured (i) to be pressed backward by the convert bracket being in the locked position and (ii) to rock forward when the cam bracket rotates to the unlocked orientation, thereby allowing the convert bracket to slide toward the released position; and
- wherein the lower end of the seesaw bracket is configured to constrain the lower latch from retracting further than the length of the release gap by abutting the latching bracket in the disengage position.

19. The method of claim 18, further comprising:
providing and configuring a spring to pull the upper end of the seesaw bracket forward when the cam bracket rotates to the unlocked orientation, thereby automatically retracting the convert bracket to the released position.

20. The method of claim 19, wherein:
- the latching bracket is affixed to an upper cam holder and to a lower cam holder, each cam holder including an angled slot configured to receive a release button shaft that pushes the cam holder transversely inward when a release button is actuated; and
- the release button comprises a release button shaft configured to insert within the angled slot of the upper and lower cam holders, the release button configured to unhook each latch from the panel of the server chassis by pushing the cam holders and the latching bracket inward, thereby retracting the latches.

* * * * *